(12) United States Patent
Ahn et al.

(10) Patent No.: US 9,899,226 B2
(45) Date of Patent: Feb. 20, 2018

(54) SEMICONDUCTOR DEVICE AND FABRICATION METHOD THEREOF

(71) Applicant: ELECTRONICS AND TELECOMMUNICATIONS RESEARCH INSTITUTE, Daejeon (KR)

(72) Inventors: Ho Kyun Ahn, Daejeon (KR); Hae Cheon Kim, Daejeon (KR); Jong Won Lim, Daejeon (KR); Dong Min Kang, Daejeon (KR); Yong Hwan Kwon, Daejeon (KR); Seong Il Kim, Daejeon (KR); Zin Sig Kim, Daejeon (KR); Eun Soo Nam, Daejeon (KR); Byoung Gue Min, Sejong (KR); Hyung Sup Yoon, Daejeon (KR); Kyung Ho Lee, Daejeon (KR); Jong Min Lee, Daejeon (KR); Kyu Jun Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/658,121

(22) Filed: Mar. 13, 2015

(65) Prior Publication Data
US 2015/0380482 A1 Dec. 31, 2015

(30) Foreign Application Priority Data

Jun. 26, 2014 (KR) ........................ 10-2014-0078693

(51) Int. Cl.
*H01L 29/40* (2006.01)
*H01L 21/28* (2006.01)
(Continued)

(52) U.S. Cl.
CPC ...... *H01L 21/28264* (2013.01); *H01L 29/407* (2013.01); *H01L 29/4236* (2013.01);
(Continued)

(58) Field of Classification Search
CPC .......................... H01L 29/407; H01L 29/404
See application file for complete search history.

(56) References Cited

U.S. PATENT DOCUMENTS

| 7,141,464 B2 | 11/2006 | Park et al. |
| 7,573,078 B2 | 8/2009 | Wu et al. |

(Continued)

FOREIGN PATENT DOCUMENTS

| KR | 10-0276077 B1 | 1/2001 |
| KR | 10-0782430 B1 | 12/2007 |

(Continued)

OTHER PUBLICATIONS

Eizo Mitani et al., "Mass-Production of High-Voltage GaAs and GaN Devices", CS MANTECH Conference, pp. 183-186, Apr. 24-27, 2006.

(Continued)

*Primary Examiner* — Peniel M Gemedzoe
*Assistant Examiner* — Christopher Johnson
(74) *Attorney, Agent, or Firm* — Rabin & Berdo, P.C.

(57) ABSTRACT

Provided herein is a semiconductor device including a substrate; an active layer formed on top of the substrate; a protective layer formed on top of the active layer and having a first aperture; a source electrode, driving gate electrode and drain electrode formed on top of the protective layer; and a first additional gate electrode formed on top of the first aperture, wherein an electric field is applied to the active layer, protective layer and driving gate electrode due to a voltage applied to each of the source electrode, drain electrode and driving gate electrode, and the first additional gate
(Continued)

electrode is configured to attenuate a size of the electric field applied to at least a portion of the active layer, protective layer and driving gate electrode.

14 Claims, 10 Drawing Sheets

(51) Int. Cl.
*H01L 29/423* (2006.01)
*H01L 29/66* (2006.01)
*H01L 29/778* (2006.01)
*H01L 29/51* (2006.01)
*H01L 29/20* (2006.01)
*H01L 29/45* (2006.01)

(52) U.S. Cl.
CPC ........ *H01L 29/42316* (2013.01); *H01L 29/51* (2013.01); *H01L 29/517* (2013.01); *H01L 29/518* (2013.01); *H01L 29/66462* (2013.01); *H01L 29/7786* (2013.01); *H01L 29/2003* (2013.01); *H01L 29/452* (2013.01); *H01L 29/513* (2013.01)

(56) References Cited

U.S. PATENT DOCUMENTS

| | | |
|---|---|---|
| 7,696,535 B2 | 4/2010 | Yang et al. |
| 2013/0069127 A1 | 3/2013 | Ahn et al. |
| 2014/0001531 A1 | 1/2014 | Chiu et al. |
| 2014/0151747 A1* | 6/2014 | Jeon .................. H01L 29/42316 257/194 |
| 2015/0060948 A1* | 3/2015 | Kawai .................... H01L 29/404 257/194 |
| 2015/0255547 A1* | 9/2015 | Yuan ..................... H01L 29/861 257/76 |

FOREIGN PATENT DOCUMENTS

| | | |
|---|---|---|
| KR | 10-2008-0036002 A | 4/2008 |
| KR | 10-2008-0101378 A | 11/2008 |
| WO | WO-2007-014036 A2 | 2/2007 |

OTHER PUBLICATIONS

A. Chini et al., "Power and Linearity Characteristics of Field-Plated Recessed-Gate AlGaN-GaN HEMTs", IEEE Electron Device Letters, vol. 25, No. 5, pp. 229-231, May 2004.

Eldad Bahat-Treidel et al., "AlGaN/GaN/AlGaN DH-HEMTs Breakdown Voltage Enhancement Using Multiple Grating Field Plates (MGFPs)", IEEE Transactions on Electron Devices, vol. 57, No. 6, pp. 1208-1216, Jun. 2010.

Ho-Kyun Ahn et al., "Normally-off dual gate AlGaN/GaN MISFET with selective area-recessed floating gate", Solid-State Electronics, vol. 95, pp. 42-45, May 2014.

\* cited by examiner

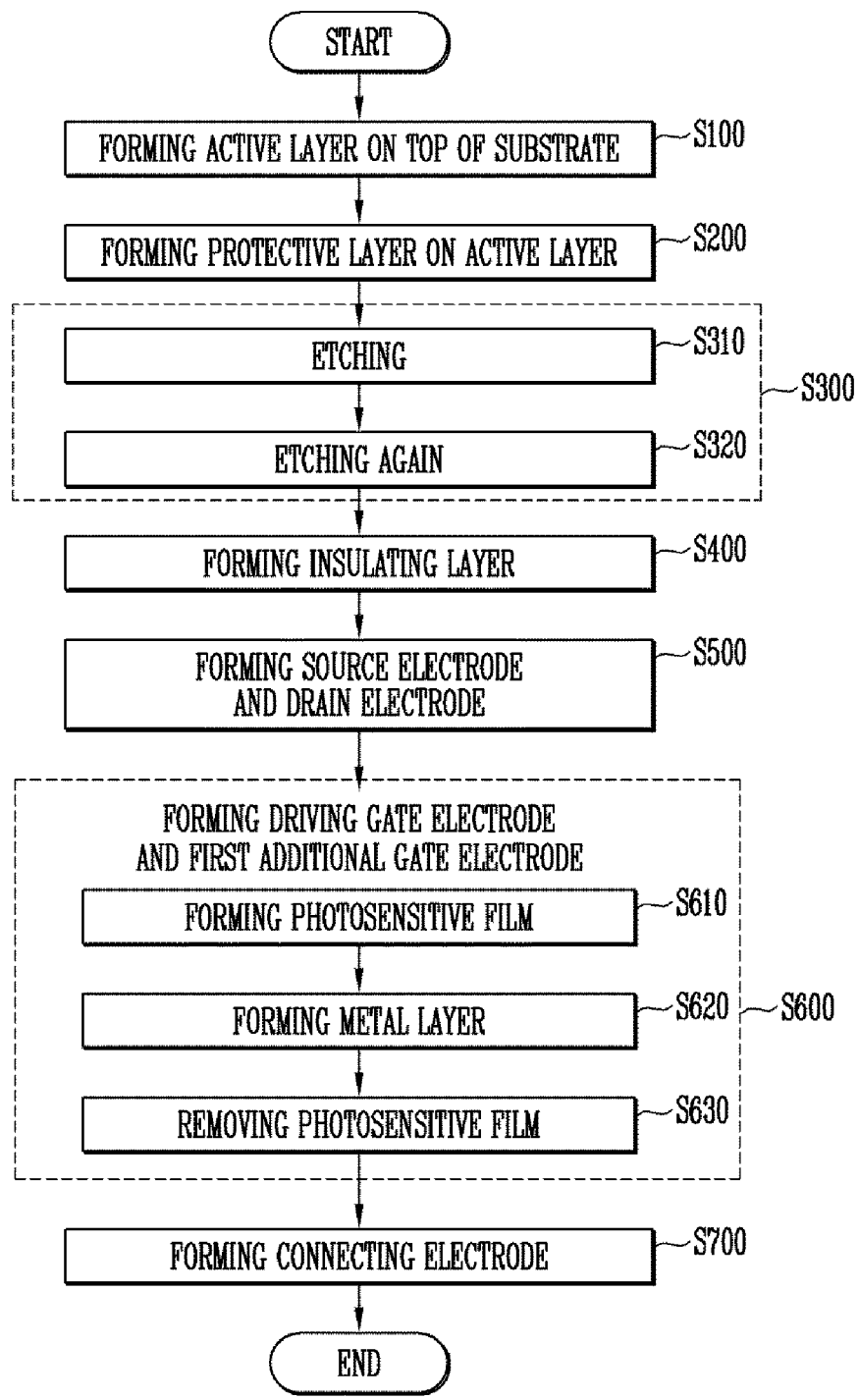

SEMICONDUCTOR DEVICE AND FABRICATION METHOD THEREOF

CROSS-REFERENCE TO RELATED APPLICATION

The present application claims priority to Korean patent application number 10-2014-0078693, filed on Jun. 26, 2014, the entire disclosure of which is incorporated herein in its entirety by reference.

BACKGROUND

Field of Invention

Various embodiments of the present disclosure relate to a semiconductor device and a fabrication method thereof, and more particularly, to a compound semiconductor device that is capable of being driven at a high voltage and where a high electric field may be applied, and a fabrication method thereof.

Description of Related Art

Compound semiconductors such as gallium arsenide (GaAs) semiconductors and indium phosphide semiconductors have excellent electron velocity characteristics than electronic devices that use silicon, and thus these compound semiconductors are being widely used in microwave or millimeter wave (10~100 GHz) band devices. HEMT (High Electron Mobility Transistor) is a type of device that uses such a compound semiconductor. HEMT has a very high cutoff frequency and a high current density, and is thus receiving attention as a device suitable for high voltage operation.

FIG. 1 is a view for explaining a conventional semiconductor device. FIG. 1 illustrates a substrate 10, an active layer 11 and protective layer (cap layer) 12 formed on top of the substrate 10, a source electrode 13a and drain electrode 13b formed on top of the protective layer 12, a driving gate electrode 16 formed on top of an etched portion of the protective layer 12 and contacts the active layer 11, an insulating layer 17 formed on top of the active layer 11, protective layer 12, source electrode 13a, drain electrode 13b and driving gate electrode 16, and an additional gate electrode (electric field electrode) 19 formed on top of the insulating layer 17.

In the case of an HEMT device that uses a heterostructure of aluminum gallium nitride (AlGaN) and gallium nitride (GaN), the active layer 11 includes a gallium nitride buffer layer and an aluminum gallium nitride barrier layer, while the protective layer 12 includes a gallium nitride (GaN) layer. In the semiconductor device illustrated in FIG. 1, even when a high voltage is applied between the source electrode 13a and drain electrode 13b, a maximum value of an electric field applied to the driving gate electrode 16 or active layer 11 is attenuated due to the additional gate electrode 19.

However, the additional gate electrode 19 electrically affects the active layer 11, protective layer 12, source electrode 13a and drain electrode 13b through the insulating layer 17, and when a stronger electric field is applied or when there is a need to further reduce an electric field in an area where an electric field is particularly concentrated, conventional methods require the addition of numerous electric field electrodes. However, these conventional methods require increased number of stages, which is a disadvantage.

SUMMARY

Various embodiments of the present disclosure are directed to a semiconductor device wherein an additional gate electrode (electric field electrode) is formed on top of a recess area, and a fabrication method thereof.

Furthermore, various embodiments of the present disclosure are directed to a semiconductor device wherein an additional gate electrode is formed on top of a recess area, thus having improved breakdown voltage characteristics and an improved stability and reliability when driven at a high voltage, and a fabrication method thereof.

An embodiment of the present disclosure provides a semiconductor device including a substrate; an active layer formed on top of the substrate; a protective layer formed on top of the active layer and having a first aperture; a source electrode, driving gate electrode and drain electrode formed on top of the protective layer; and a first additional gate electrode formed on top of the first aperture, wherein an electric field is applied to the active layer, protective layer and driving gate electrode due to a voltage applied to each of the source electrode, drain electrode and driving gate electrode, and the first additional gate electrode is configured to attenuate a size of the electric field applied to at least a portion of the active layer, protective layer and driving gate electrode.

Another embodiment of the present disclosure provides a method for fabricating a semiconductor device, the method including forming an active layer on top of a substrate; forming a protective layer on top of the active layer; etching the protective layer to have a first aperture; forming an insulating layer on top of the protective layer; and forming a driving gate electrode and first additional gate electrode on top of the insulating layer, wherein the first additional gate electrode is formed in a position corresponding to the first aperture.

Various aforementioned embodiments of the present disclosure have an effect of providing a semiconductor device wherein an additional gate electrode (electric field electrode) is formed on top of a recess area, and a fabrication method thereof.

Furthermore, various aforementioned embodiments of the present disclosure have an effect of providing a semiconductor device wherein an additional gate electrode is formed on top of a recess area, thus having improved breakdown voltage characteristics and a reduced leakage current, and an improved stability and reliability when driven at a high voltage, and a fabrication method thereof.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 5 is a flowchart for explaining the method for fabricating a semiconductor device according to an embodiment of the present disclosure.

DETAILED DESCRIPTION

Figure 1:
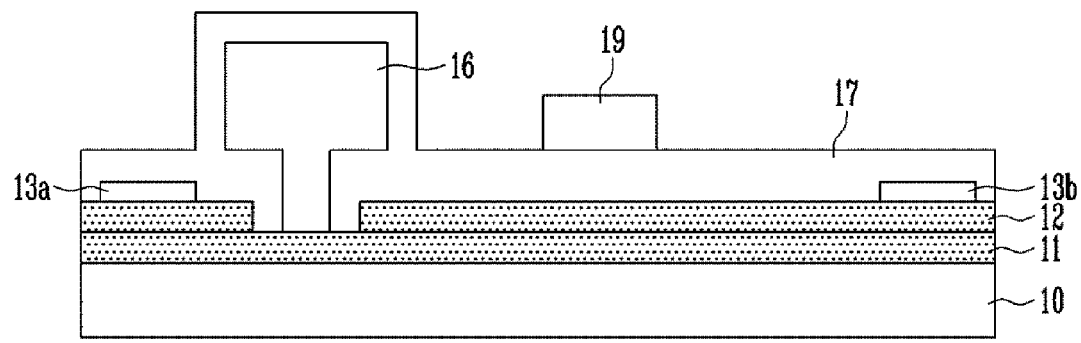
FIG. 1 is a cross-sectional view for explaining a conventional semiconductor device.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 2 (FIGS. 2A to 2L) illustrate a method for fabricating a semiconductor device according to an embodiment of the present disclosure. FIG. 2A illustrates a cross-sectional view for explaining forming an active layer and protective layer of the method for fabricating a semiconductor device according to the embodiment of the present disclosure. Referring to FIG. 2A, an active layer 21 and protective layer 22 are formed on top of a substrate 20. The substrate 20 may be a compound semiconductor substrate or another type of semiconductor substrate, and the materials constituting the substrate 20 may be gallium nitride (GaN), silicon (Si), silicon carbide (SiC), or semi-insulating gallium arsenic (GaAs). It was already aforementioned that in the case of an HEMT device that uses a heterostructure of aluminum gallium nitride (AlGaN) and gallium nitride (GaN), the active layer 21 may include a gallium nitrite buffer layer and aluminum gallium nitride barrier layer, and that the protective layer 22 may include a GaN layer.

Figure 2A:
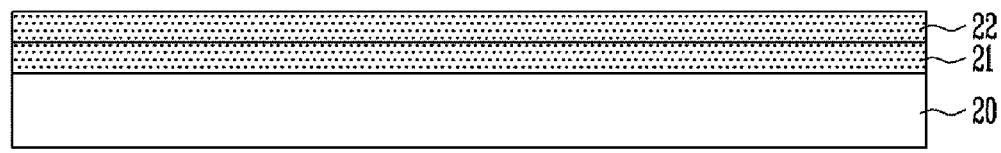
FIG. 2A is a cross-sectional view for explaining forming an active layer and protective layer of a method for fabricating a semiconductor device according to an embodiment of the present disclosure.
Figure 2B:
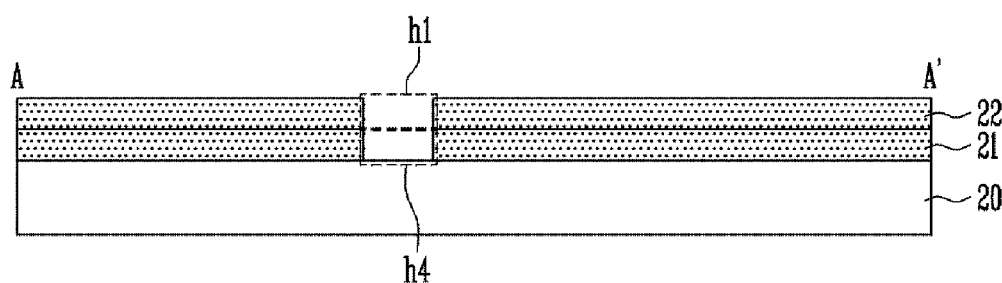
FIG. 2B is a cross-sectional view for explaining etching the protective layer to have a first aperture of the method for fabricating a semiconductor device according to the embodiment of the present disclosure.
Figure 2C:
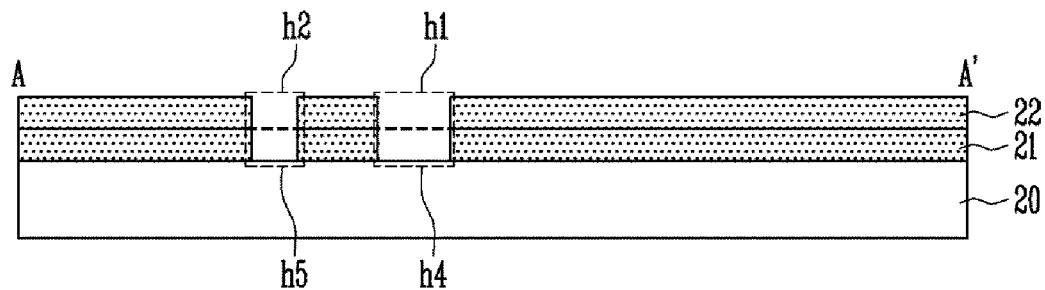
FIGS. 2C and 2D are cross-sectional views for explaining etching the protective layer again to have a second aperture of the method for fabricating a semiconductor device according to the embodiment of the present disclosure.
Figure 2D:
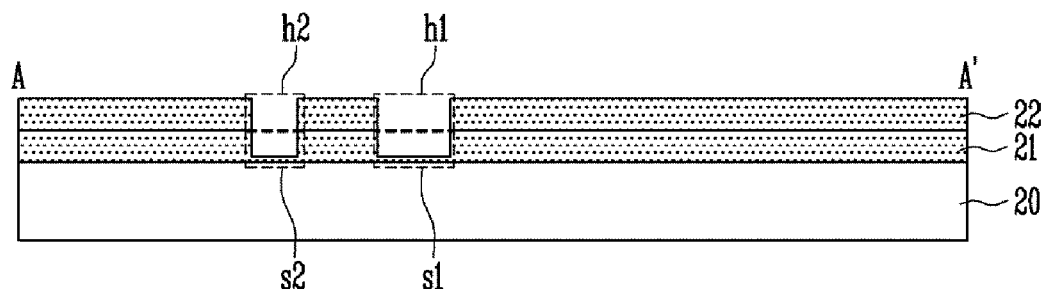
Figure 2E:
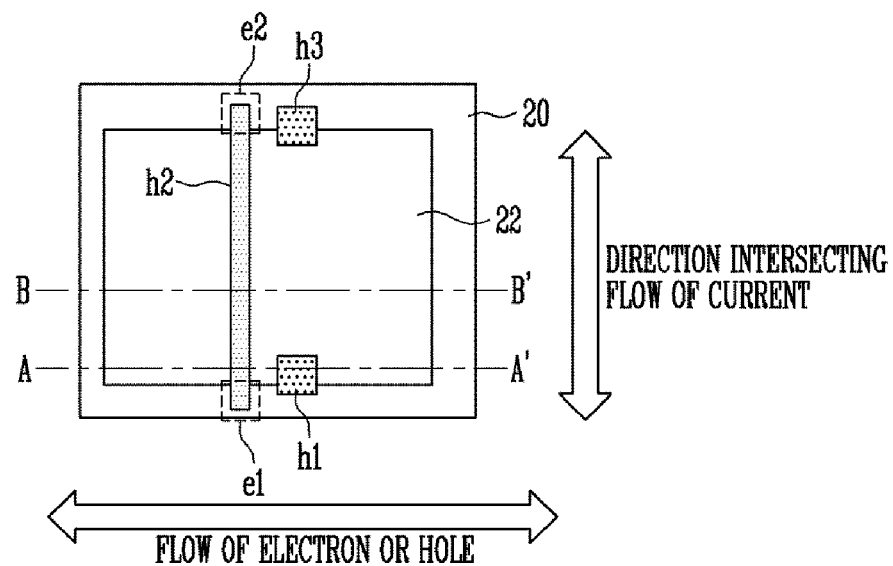
FIG. 2E is a planar view for explaining etching the protective layer to have the second aperture of the method for fabricating a semiconductor device according to the embodiment of the present disclosure.

FIG. 2B is a cross-sectional view for explaining etching the protective layer to have a first aperture of the method for fabricating a semiconductor device according to the embodiment of the present disclosure, and particularly, a cross-sectional view between A and A' (see FIG. 2E). Referring to FIG. 2B, the protective layer 22 includes a first aperture h1, and the active layer 21 has a fourth aperture h4 formed in a position corresponding to the first aperture h1. In a subsequent process, a first additional gate electrode 29-1 will be formed in a position corresponding to the first aperture h1 (see FIG. 2K).

FIGS. 2C and 2D are cross-sectional views for explaining etching the protective layer again to have a second aperture of the method for fabricating a semiconductor device according to the embodiment of the present disclosure. FIG. 2C illustrates a cross-sectional view in a case where the active layer 21 corresponding to the first aperture h1 and second aperture h2 areas are all etched. Referring to FIG. 2C, the protective layer 22 includes the first aperture h1 and second aperture h2, and the active layer 21 has a fourth aperture h4 formed in a position corresponding to the first aperture h1 and a fifth aperture h5 formed in a position corresponding to the second aperture h2. In a subsequent process, a driving gate electrode 28 will be formed in a position corresponding to the second aperture h2 (see FIG. 2K). FIG. 2D is a cross-sectional view of a case where the active layer 21 that corresponds to the first aperture h1 and second aperture h2 are partially etched. Either FIG. 2C or FIG. 2D is performed selectively. Referring to FIG. 2D, the protective layer 22 includes the first aperture h1 and second aperture h2, and the active layer 21 includes a first trench s1 formed in a position corresponding to the first aperture h1, and a second trench s2 formed in a position corresponding to the second aperture h2. Depending on the specifications required when fabricating a semiconductor device, it is possible to select whether to etch all the protective layer 22 and active layer 21 that correspond to the positions of the first aperture h1 and second aperture h2 and form the fourth aperture h4 and fifth aperture h5, or to etch the protective layer 22 and active layer 21 partially and form the first trench s1 and second trench s2. In FIGS. 2C and 2D, the second aperture h2 is formed where the driving gate electrode 28 will be formed, but the second aperture h2 may not be needed when fabricating a depleted type mode device. In such a case, there will be no second aperture h2, fifth aperture h5, or second trench s2, and the driving gate electrode 28 may be formed on top of the protective layer 22. In the present embodiment, the second aperture h2 is formed after the first aperture h1 is formed, but this is because since the functions of the first additional gate electrode 29-1 to be formed in a position corresponding to the first aperture h1 and the functions of the driving gate electrode 28 to be formed in a position corresponding to the second aperture h2 are different from each other, the etching specifications (etching method, etching width, and etching depth and so forth) are different as well. If the etching specifications were not so strict, the first aperture h1 and second aperture h2 may be formed at the same time. Referring to FIGS. 2C and 2D, a recess area is formed, and in a subsequent process, the driving gate electrode 28 and first additional gate electrode 29-1 will be formed (see FIG. 2K). However, explanation on FIGS. 2E to 2L will be made based on the assumption that the fourth aperture h4 and fifth aperture h5 are formed. The process of etching the protective layer 22 and active layer 21 to form a recess area is the most important process in an HEMT or MESFET (MEtal Semiconductor Field Effect Transistor) device, and this process is generally conducted while measuring a current in a single step or in numerous steps of a wet or dry etching or in a combination of the dry and wet etching. A wet etching may be performed using an etching solution where phosphoric acid ($H_3PO_4$), hydrogen peroxide ($H_2O_2$) and water ($H_2O$) are mixed therein, and a dry etching may be performed using gas such as $CF_4$, boron trichloride ($BCl_3$), $Cl_2$ and $SF_6$.

FIG. 2E is a planar view for explaining etching the protection layer to have a second aperture of the method for fabricating a semiconductor device according to the embodiment of the present disclosure. It can be seen that the active layer (not illustrated) and the protective layer 22 are formed on top of the substrate 20, and the first aperture h1, second aperture h2 and third aperture h3 are formed. In a case where the semiconductor device is completed through a subsequent process, the first additional gate electrode 29-1, driving gate electrode 28, and second additional gate electrode 29-2 are each formed in a position corresponding to the first aperture h1, second aperture h2 and third aperture h3, respectively (see FIG. 2L). Herein, an electrical effect caused by each voltage applied to the source electrode 27a, drain electrode 27b and driving gate electrode 28 only takes effect within a certain area (see FIG. 2L). This certain area is called an active area, and in this specification, the area where the active layer (not illustrated) and protective layer 22 are formed will be referred to as the active area, for convenience of explanation. In FIG. 2E, an electron or hole flows in a direction illustrated in FIG. 2E, and herein, one of the areas where a strongest electric field is applied are two corner e1, e2 portions that are near the boundaries of the active area. Therefore, the first aperture h1 and third aperture h3, that are recess areas, are formed where an electron or hole may flow from the two corners e1, e2. That is, the first aperture h1 and third aperture h3 are formed on top of the boundaries of the active area. In a subsequent process, the first additional gate electrode 29-1 and second additional gate electrode 29-2 are formed each on top of the second aperture h2 and third aperture h3, respectively, so as to attenuate an intensity of an electric field being applied to the two corners e1, e2 of the driving gate electrode 28 (see FIG. 2K). The cross-sectional view illustrating between A and A' shows the first aperture h1 whereas the cross-sectional view illustrating between B and B' does not show the first aperture h1.

Figure 2F:
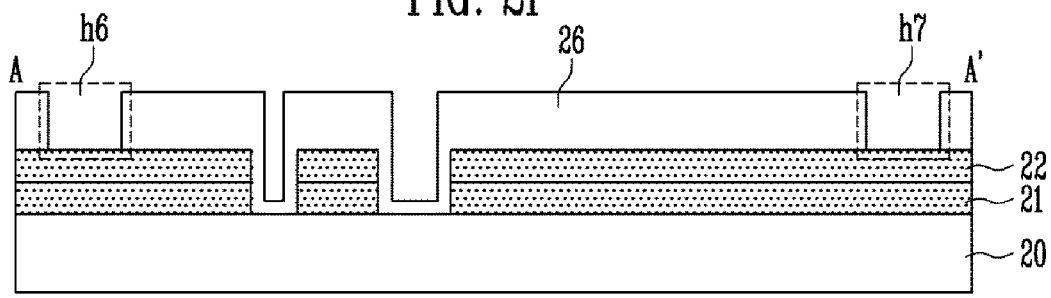
FIG. 2F is a cross-sectional view for explaining forming an insulating layer of the method for fabricating a semiconductor device according to the embodiment of the present disclosure.

FIG. 2F is a cross-sectional view for explaining forming an insulating layer of the method for fabricating a semiconductor device according to the embodiment of the present disclosure. The insulating layer 26 is formed on top of the protecting layer 22, first aperture h1 and second aperture h2, and at least one material selected from alumina ($Al_2O_3$), silicon nitride, silicon oxide, BenzoCycloButene (BCB), and porous silicon thin film may constitute the insulating layer 26. The insulating layer 26 may be formed by a method of depositing different materials for a plurality of times. For example, the insulating layer 26 may be formed by depositing an alumina film, and then depositing silicon nitride or silicon oxide on top of the alumina film. The insulating layer 26 has a sixth aperture h6 and seventh aperture h7. The sixth aperture h6 and seventh aperture h7 may be formed by selectively etching only a desired portion after forming the insulating layer 26. The insulating layer 26 may be etched by a dry etching method or wet etching method. Dry etching methods that can be used herein include RIE (Reactive Ion Etching), MERIE (Magnetically Enhanced Reactive Ion Etching) and ICP (Inductive coupled plasma).

Figure 2G:
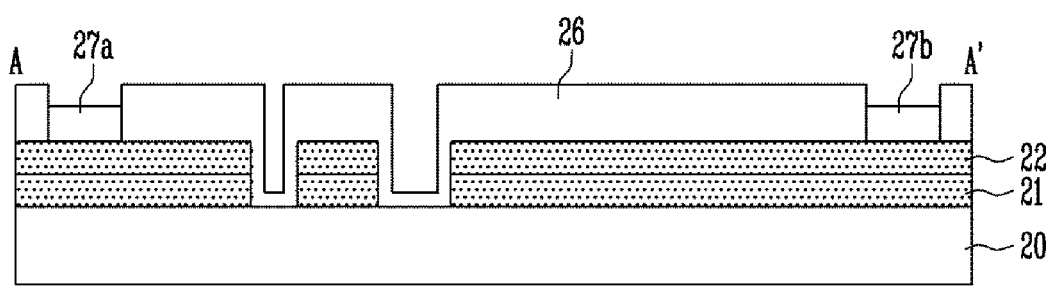
FIG. 2G is a cross-sectional view between A and A' for explaining forming a source electrode and drain electrode of the method for fabricating a semiconductor device according to the embodiment of the present disclosure.

FIG. 2G is a cross-sectional view between A and A' for explaining forming a source electrode and drain electrode of the method for fabricating a semiconductor device according to the embodiment of the present disclosure. The source electrode 27a and drain electrode 27b will be formed on top of the sixth aperture h6 and seventh aperture h7 and be electrically connected to the protective layer 22 (see FIG. 2G). At least one material selected from titanium (Ti), aluminum (Al), nickel (Ni), gold (Au), germanium (Ge) and platinum (Pt) may constitute the source electrode 27a and drain electrode 27b. For example, in a process for fabricating an HEMT (High Electron Mobility Transistor) device that uses a gallium nitride (GaN) compound semiconductor, the source electrode 27a and drain electrode 27b may be formed by depositing Ti, Al, Ni, and Au successively. In a process for fabricating an HEMT or MESFET device that uses gallium arsenide (GaAs) compound semiconductor, the source electrode 27a and drain electrode 27b may be formed by depositing AuGe, Ni, and Au successively. After being deposited, the source electrode 27a and drain electrode 27b may receive rapid thermal annealing (RTA). In a case where an area corresponding to the position of the first aperture h1 is etched together, the first additional gate electrode 29-1 to be formed subsequently may contact the active layer 21.

Figure 2H:
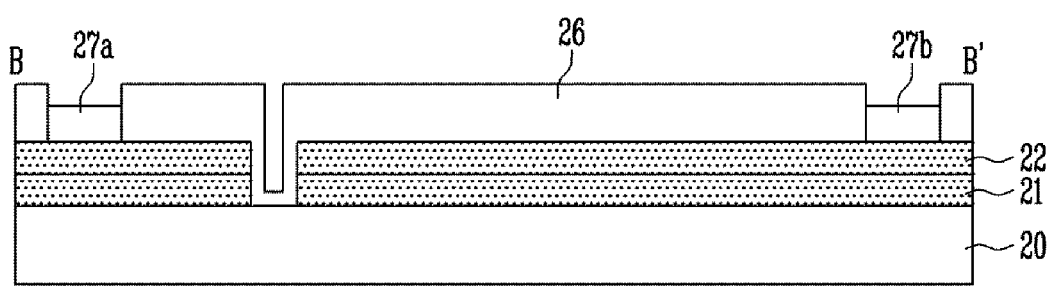
FIG. 2H is a cross-sectional view between B and B' for explaining forming the source electrode and drain electrode of the method for fabricating a semiconductor device according to the embodiment of the present disclosure.

FIG. 2H is a cross-sectional view between B and B' for explaining forming the source electrode and drain electrode of the method for fabricating a semiconductor device according to the embodiment of the present disclosure. Herein, other parts are the same as in FIG. 2G, except that the first aperture h1 is not shown since it is a view of a different cross-section.

Figure 2I:
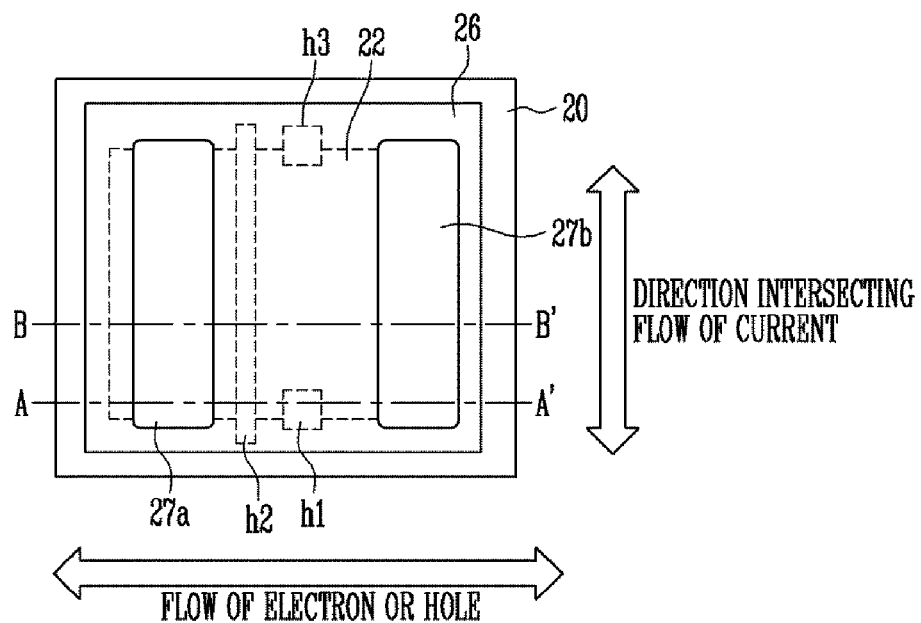
FIG. 2I is a planar view for explaining forming the source electrode and drain electrode of the method for fabricating a semiconductor device according to the embodiment of the present disclosure.

FIG. 2I is a planar view for explaining forming the source electrode and drain electrode of the method for fabricating a semiconductor device according to the embodiment of the present disclosure. The protective layer 22, first aperture h1 and second aperture h2 should not be shown since there is the insulating layer 26 on top of them, but they are shown in dotted lines for convenience of explanation and comparison with FIG. 2E. After the insulating layer 26 is formed, it is partially etched, and the source electrode 27a and drain electrode 27b are formed on top of the etched portion.

Figure 2J:
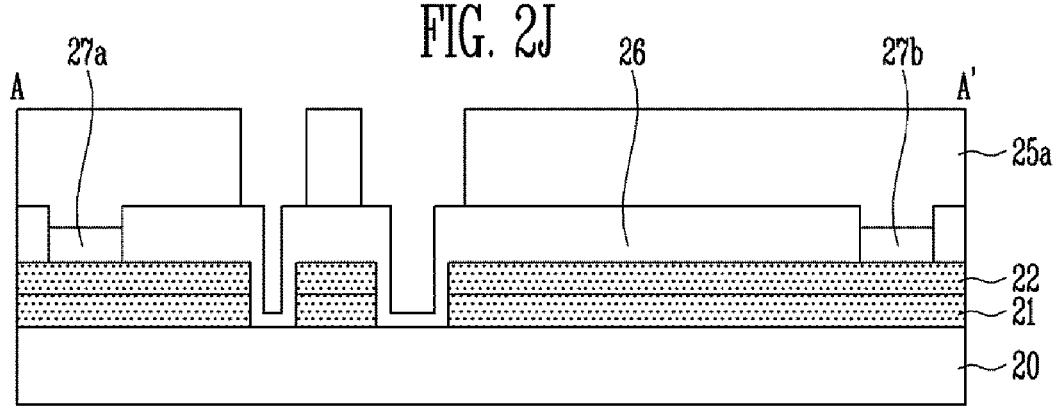
FIG. 2J is a cross-sectional view for explaining forming a photosensitive film of the method for fabricating a semiconductor device according to the embodiment of the present disclosure.

FIG. 2J is a cross-sectional view for explaining forming a photosensitive film of the method for fabricating a semiconductor device according to the embodiment of the present disclosure. A photosensitive film 25a is formed and patterned on top of the insulating layer 26, source electrode 27a and drain electrode 27b.

Figure 2K:
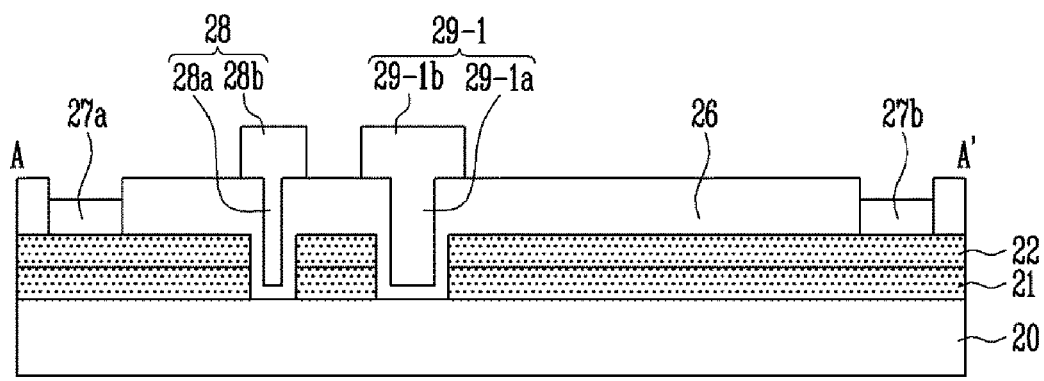
FIG. 2K is a cross-sectional view for explaining forming a driving gate electrode and first additional gate electrode of the method for fabricating a semiconductor device according to the embodiment of the present disclosure.

FIG. 2K is a cross-sectional view for explaining forming a driving gate electrode and first additional gate electrode of the method for fabricating a semiconductor device according to the embodiment of the present disclosure. Referring to FIG. 2K, the driving gate electrode 28 and first additional gate electrode 29-1 are formed through a lift-off process. The lift-off process is a method for forming a metal layer on a portion of a substrate by forming and patterning a photosensitive film, depositing metal, and then removing the photosensitive film. After the photosensitive film 25a is formed and patterned (see 2J), the metal layer is deposited, and then the photosensitive film 25a is removed, and thus the driving gate electrode 28 and first additional gate electrode 29-1 are formed on a portion of the substrate. When depositing metal in the lift-off process, a plurality of different kinds of metal may be deposited successively. For example, in a case of fabricating an HEMT device that uses a GaN compound semiconductor, Ni and Au may be deposited successively, and in a case of fabricating an HEMT or MESFET (MEtal Semiconductor Field Effect Transistor) device that uses a GaAs compound semiconductor, Ti, Pt and Au may be deposited successively. When removing the photosensitive film after depositing the metal, the metal deposited on top of the photosensitive film 25a is removed together with the photosensitive film, and the metal deposited on top of the insulating layer 26 by the patterning remains on top of the insulating layer 26 even after the photosensitive film 25a is removed. The first additional gate electrode 29-1 includes a first additional gate electrode lower part 29-1a having a first area and a first additional gate electrode upper part 29-1b having a second area that is bigger than the first area. Furthermore, the driving gate electrode 28 includes a driving gate electrode lower part 28a, and a driving gate electrode upper part 28b that has a bigger area than the area of the driving gate electrode lower part 28a. Forming such a T-shaped gate electrode improves velocity characteristics and noise characteristics, and reduces a gate width without increasing a resistance of the gate electrode. Although not illustrated in FIG. 2K, in a case where a second additional gate electrode 29-2 is formed, in the same manner as the first additional gate electrode 29-1, the second additional gate electrode 29-2 includes a second additional gate electrode lower part 29-2a having a third area and a second additional gate electrode upper part 29-2b having a fourth area that is bigger than the third area.

Figure 2L:
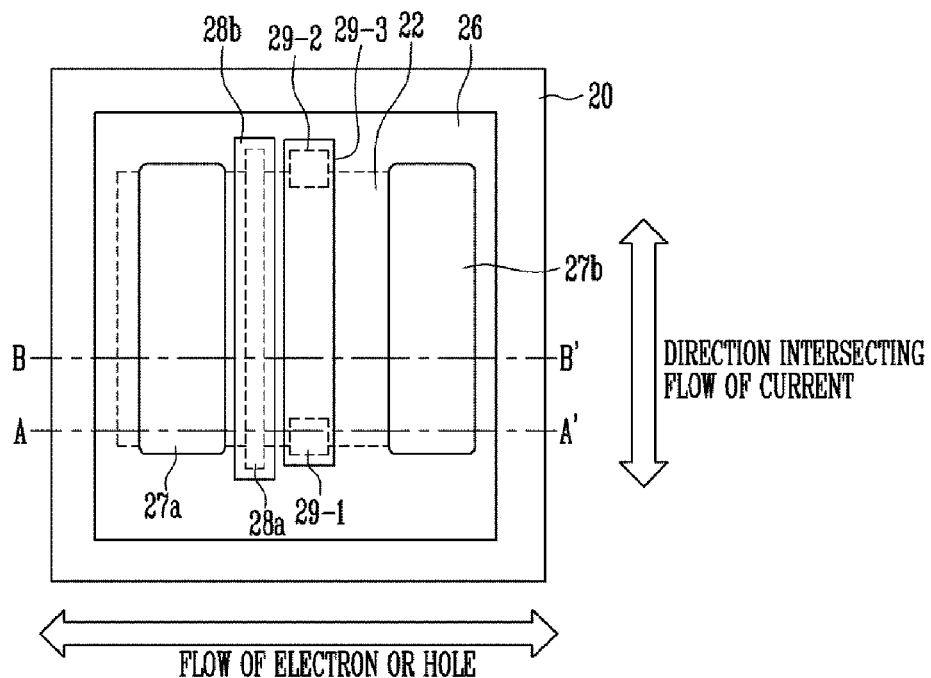
FIG. 2L is a planar view for explaining the semiconductor device according to the embodiment of the present disclosure.

FIG. 2L is a planar view for explaining the semiconductor device according to the embodiment of the present disclosure. Although the protective layer 22, driving gate electrode lower part 28a, first additional gate electrode 29-1, and second additional gate electrode 29-2 are not shown in the planar view, they are shown in dotted lines in the planar view for convenience of explanation. It can be seen that the driving gate electrode 28, first additional gate electrode 29-1, and second additional gate electrode 29-2 are formed after the step of forming the source electrode and drain electrode illustrated in FIG. 2I. Furthermore, after the step of forming the gate electrode and additional gate electrode illustrated in FIG. 2J, a connecting electrode 29-3 is formed on top of the first additional gate electrode 29-1 and second additional gate electrode 29-2. The connecting electrode 29-3 electrically connects the first additional gate electrode 29-1 and second additional gate electrode 29-2, and the connecting electrode 29-3 may be formed directly on top of the insulating layer 26, or may be formed in an air-bridge format so that it does not touch the insulating layer 26. The first additional gate electrode 29-1 and second additional gate electrode 29-2 may be electrically connected to the driving gate electrode 28 and source electrode 27a, or may be electrically floated. Referring to FIGS. 2A to 2L, a semiconductor device was explained that has the insulating layer 26 between the driving gate electrode 28 and substrate 20, or between the driving gate electrode 28 and active layer 21. Such a structure may be related to a power device.

FIG. 3 (FIGS. 3A to 3J) illustrate a method for fabricating a semiconductor device according to another embodiment of the present disclosure. FIG. 3A is a cross-sectional view for explaining forming an active layer and protective layer of the method for fabricating a semiconductor device according to the another embodiment of the present disclosure. Since this embodiment is not so much different from that of FIG. 2A, detailed explanation may be omitted. An active layer 31 is formed on top of a substrate 30, and a protective layer 32 is formed on top of the active layer 31. The materials constituting the active layer 31 and protective layer 32 are very similar to the materials constituting the active layer 21 and protective layer 22, and thus detailed explanation may be omitted.

Figure 3A:
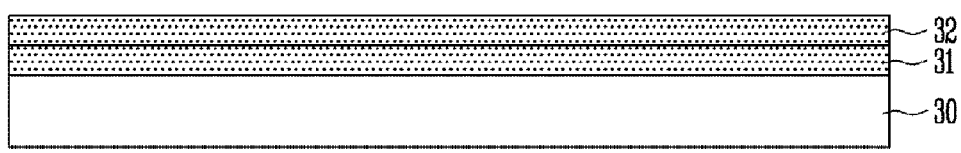
FIG. 3A is a cross-sectional view for explaining forming an active layer and protective layer of a method for fabricating a semiconductor device according to another embodiment of the present disclosure.
Figure 3B:
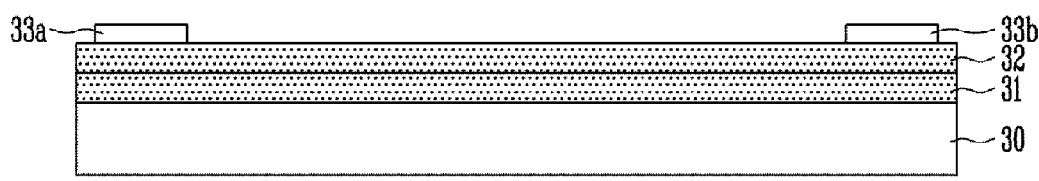
FIG. 3B is a cross-sectional view for explaining forming a source electrode and drain electrode of the method for fabricating a semiconductor device according to the another embodiment of the present disclosure.

FIG. 3B is a cross-sectional view for explaining forming a source electrode and drain electrode of the method for fabricating a semiconductor device according to the another embodiment of the present disclosure. The source electrode 33a and drain electrode 33b are formed on top of the protective layer 32. The materials that constitute the source electrode 33a and drain electrode 33b are very similar to the materials constituting the source electrode 27a and drain electrode 27b, and thus detailed explanation may be omitted.

Figure 3C:
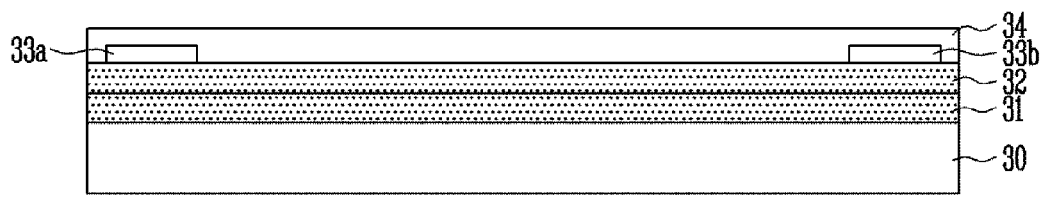
FIG. 3C is a cross-sectional view for explaining forming an insulating layer of the method for fabricating a semiconductor device according to the another embodiment of the present disclosure.

FIG. 3C is a cross-sectional view for explaining forming an insulating layer of the method for fabricating a semiconductor device according to the another embodiment of the present disclosure. The insulating layer 34 is formed on top of the protective layer 32, source electrode 33a and drain electrode 33b. The materials that constitute the insulating layer 34 and the forming method thereof are very similar to those of the insulating layer 26, and thus detailed explanation may be omitted.

Figure 3D:
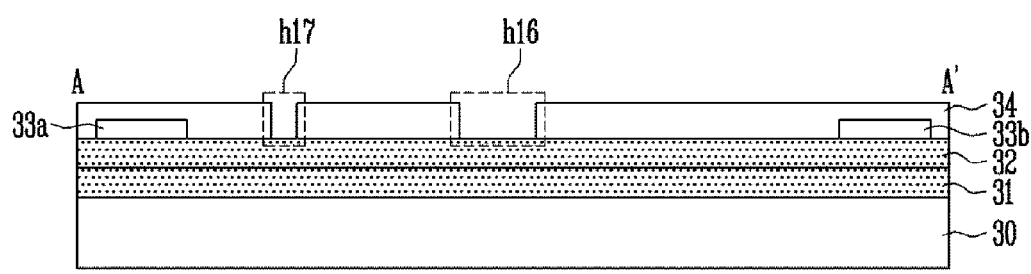
FIG. 3D is a cross-sectional view for explaining etching an insulating layer of the method for fabricating a semiconductor device according to the another embodiment of the present disclosure.

FIG. 3D is a cross-sectional view for explaining etching the insulating layer of the method for fabricating a semiconductor device according to the another embodiment of the present disclosure. The insulating layer 34 is etched to form a sixth aperture h16 and seventh aperture h17. A first aperture h11 and second aperture h12 will each be formed in a position corresponding to the sixth aperture h16 and seventh aperture h17 (see FIG. 3G and FIG. 3H). That is, a patterned insulating layer 34 may be used as a mask for etching the protective layer 32 or active layer 31. Furthermore, a first additional gate electrode 38-1 and driving gate electrode 37 will each be formed in a position corresponding to the sixth aperture h16 and seventh aperture h17 (see FIG. 3I).

Figure 3E:
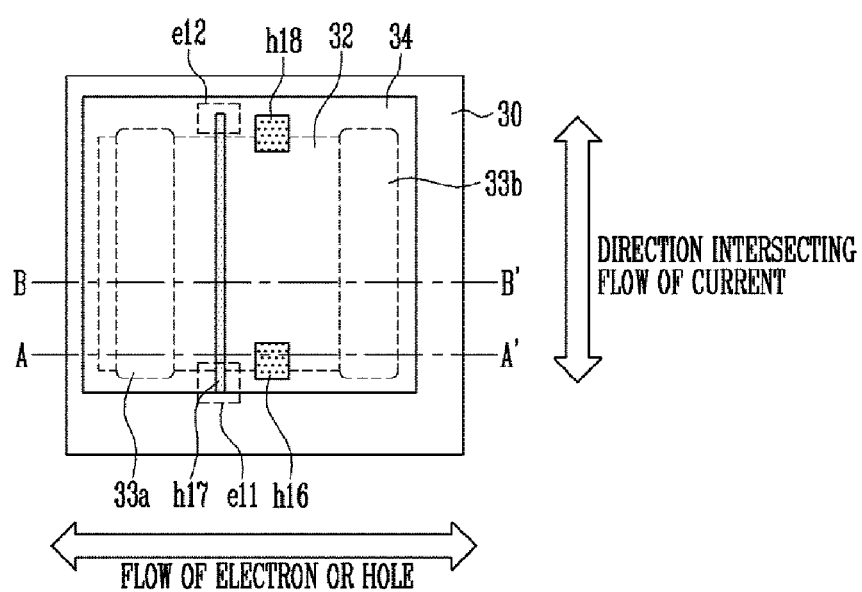
FIG. 3E is a planar view for explaining etching the insulating layer of the method for fabricating a semiconductor device according to the another embodiment of the present disclosure.

FIG. 3E is a planar view for explaining etching the insulating layer of the method for fabricating a semiconductor device according to the another embodiment of the present disclosure. For convenience of explanation, the protective layer 32, source electrode 33a, and drain electrode 33b covered by the insulating layer 34 are shown in dotted lines. It can be seen that the active layer (not illustrated) and protective layer 32 are formed on top of the substrate 30, and the sixth aperture h16, seventh aperture h7 and eighth aperture h18 are formed. Herein, for convenience of explanation, the area where the active layer (not illustrated) and protective layer 32 are formed is referred to as an active area. In a case where the semiconductor device is completed through a subsequent process, the first additional gate electrode 38-1, driving gate electrode 37 and second additional gate electrode 38-2 are each formed in a position corresponding to the sixth aperture h16, seventh aperture h17, and eighth aperture h18, respectively (see FIG. 3J). In FIG. 3E, an electron or hole flows in a direction illustrated in FIG. 3E, and herein, one of the areas where a strongest electric field is applied are two corner e11, e12 portions that are near the boundaries of the active area. Therefore, the sixth aperture h16 and eighth aperture h18, that are recess areas, are formed where an electron or hole may flow from the two corners e11, e12. That is, the sixth aperture h16 and eighth aperture h18 are formed on top of the boundaries of the active area. In a subsequent process, the first additional gate electrode 38-1 and second additional gate electrode 38-2 are formed each on top of the sixth aperture h16 and eighth aperture h18, respectively, so as to attenuate an intensity of an electric field being applied to the two corners e11, e12 of the driving gate electrode 37 (see FIG. 3J). The method of etching the insulating layer 34 is very similar to the method of etching the insulating layer 26, and thus detailed explanation is omitted.

Figure 3F:
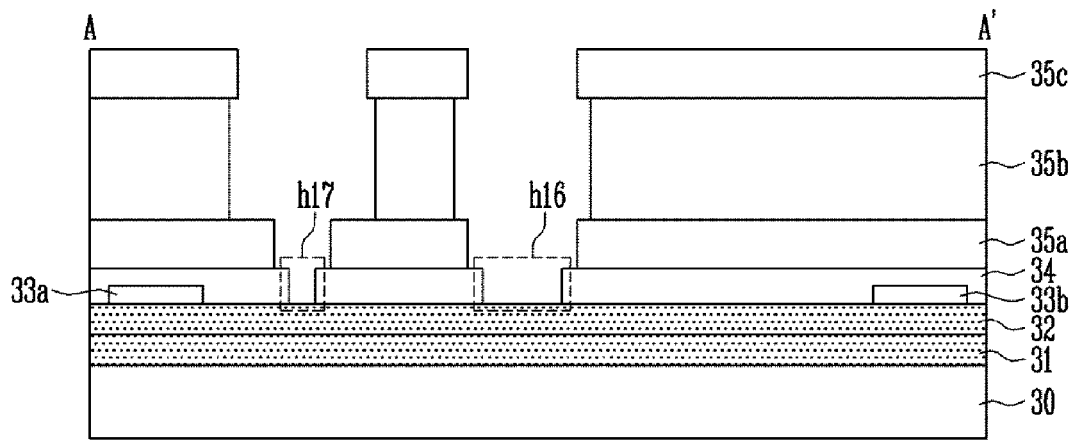
FIG. 3F is a cross-sectional view for explaining forming a photosensitive film of the method for fabricating a semiconductor device according to the another embodiment of the present disclosure.

FIG. 3F is a cross-sectional view for explaining forming a photosensitive film of the method for fabricating a semiconductor device according to the another embodiment of the present disclosure. On top of the insulating layer 34, a first photosensitive film 35a, second photosensitive film 35b, and third photosensitive film 35c may be formed successively, and the first photosensitive film 35a, second photosensitive film 35b, and third photosensitive film 35c may all be referred to collectively as a photosensitive film 35. The first photosensitive film 35a, second photosensitive film 35b, and third photosensitive film 35c may be configured by a combination of polymethyl metacrylate (PMMA)/copolymer/polymethyl metacrylate (PMMA), ZEP/PMGI/ZEP etc. When forming the photosensitive film 35, the photosensitive film 35 may be patterned using the electron-beam lithography process, and the second photosensitive film 35b may be formed after the forming and patterning of the first photosensitive film 35a. Furthermore, in FIG. 3F, the photosensitive film 35 is formed to have three layers, but the photosensitive film 35 may be formed to have one or two layers instead.

Figure 3G:
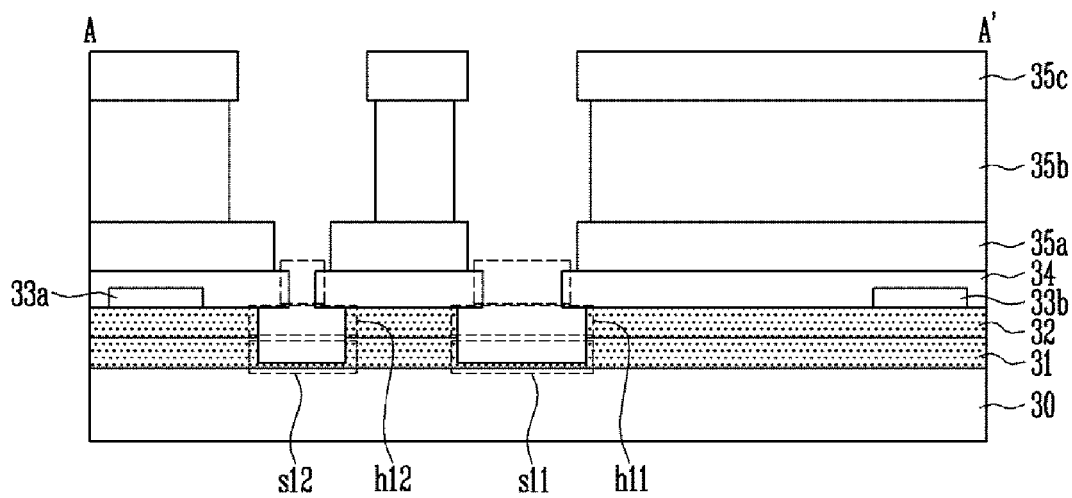
FIG. 3G and FIG. 3H are cross-sectional views for explaining etching a protective layer and active layer of the method for fabricating a semiconductor device according to the another embodiment of the present disclosure.
Figure 3H:
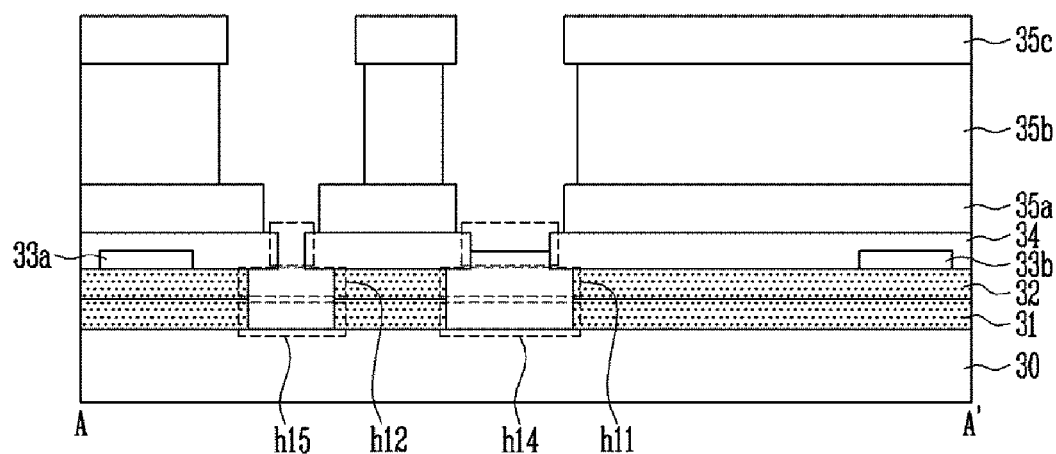
Figure 3I:
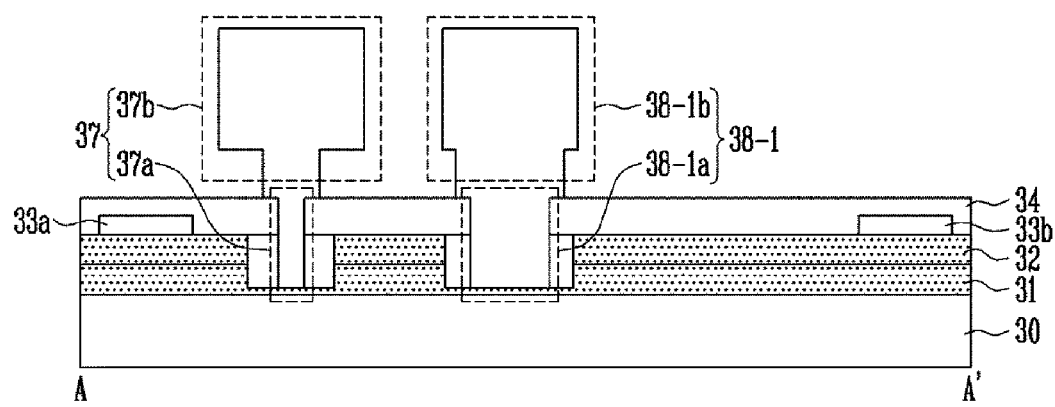
FIG. 3I is a cross-sectional view for explaining forming a driving gate electrode and first additional gate electrode of the method for fabricating a semiconductor device according to the another embodiment of the present disclosure.

FIGS. 3G and 3H are cross-sectional views for explaining etching the protective layer and active layer of the method for fabricating a semiconductor device according to another embodiment of the present disclosure. In FIG. 3G, the protective layer 32 in a position corresponding to the sixth aperture h16 and seventh aperture h17 are all etched to form the first aperture h11 and second aperture h12, and the active layer 31 is partially etched to form the first shallow, or trench, s11 and second trench s12. Referring to FIG. 3H, the protective layer 32 in a position corresponding to the sixth aperture h16 and seventh aperture h17 are all etched to form the first aperture h11 and second aperture h12, and the active layer 31 is also all etched to form the fourth aperture h14 and fifth aperture h15. The process of etching the active layer 31 and protective layer 32 to form a recess area is very similar to the process of etching the active layer 21 and protective layer 22 and forming a recess area, and thus detailed explanation may be omitted. Depending on the specifications required when fabricating a semiconductor device, it is possible to select whether to etch all the active layer 31 that corresponds to the positions of the first aperture h11 and second aperture h12 and form the fourth aperture h14 and fifth aperture h15, or to etch the active layer 31 partially and form the first trench s11 and second trench s12. However, explanation on FIGS. 3I to 3J will be made based on an assumption that the first trench s11 and second trench s12 are formed as in FIG. 3G. Furthermore, as aforementioned, the second aperture h12 may not be needed when fabricating a depleted type mode device. In such a case, there will be no second aperture h12, fifth aperture h15, or second trench s12, and the driving gate electrode 37 may be formed on top of the protective layer 32. FIG. 3I is a cross-sectional view for explaining forming the driving gate electrode and first additional gate electrode of the method for fabricating a semiconductor device according to the another embodiment of the present disclosure. Referring to FIG. 3I, the driving gate electrode 37 and first additional gate electrode 38-1 are formed through the lift-off process. Explanation on the lift-off process, materials constituting the driving gate electrode 37 and the first additional gate electrode 38-1 were already made referring to FIG. 2K, and thus detailed explanation may be omitted. The first additional gate electrode 38-1 includes a first additional gate electrode lower part 38-1a having a first area and a first additional gate electrode upper part 38-1b having a second area that is bigger than the first area. Furthermore, the driving gate electrode 37 includes a driving gate electrode lower part 37a and a driving gate electrode upper part 37b having a area bigger than the area of the driving gate electrode lower part 37a. Furthermore, the second area that is the area of the first additional gate electrode upper part 38-1b may be, for example, defined as a minimum area of the first additional gate electrode upper part 38-1b, or defined as an average area of the first additional gate electrode upper part 38-1b. Although not illustrated in FIG. 3I, when the second additional gate electrode 38-2 is formed, just as the first additional gate electrode 38-1, the second additional gate electrode 38-2 includes a second additional gate electrode lower part 38-2a having a third area and a second additional gate electrode upper part 38-2b having a fourth area that is bigger than the third area. The advantages of such a gate electrode, materials that constitute the driving gate electrode 37, and materials constituting the first additional gate electrode 38-1 were already explained with reference to FIG. 2K.

Figure 3J:
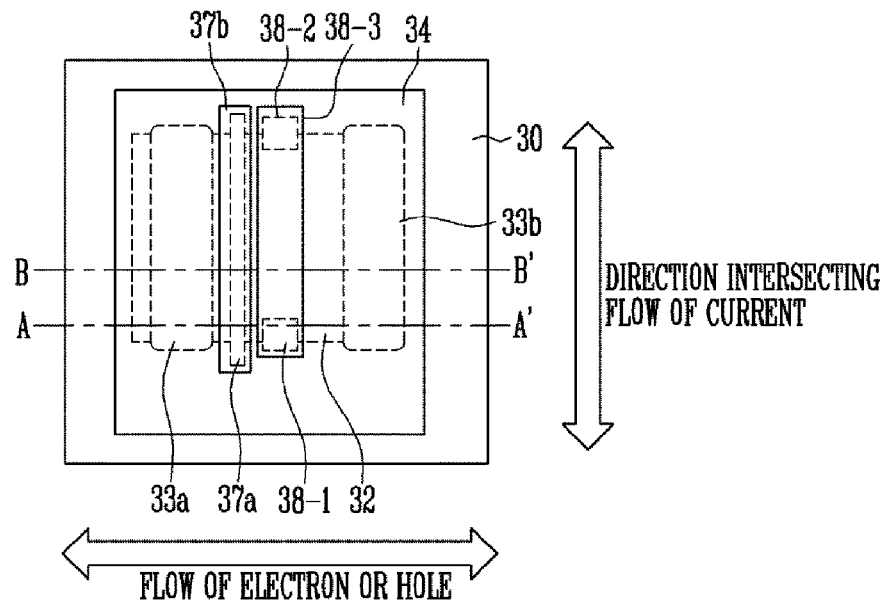
FIG. 3J is a planar view for explaining the semiconductor device according to the another embodiment of the present disclosure.

FIG. 3J is a planar view for explaining the semiconductor device according to the another embodiment of the present disclosure. For convenience of explanation, the source electrode 33a, drain electrode 33b, driving gate electrode lower part 37a, first additional gate electrode 38-1, and second additional gate electrode 38-2 are shown in dotted lines. In can be seen that after the etching the insulating layer illustrated in FIG. 3E, the driving gate electrode 37, first additional gate electrode 38-1, and second additional gate electrode 38-2 are formed. Furthermore, after the etching the gate electrode and additional gate electrode illustrated in FIG. 3I, a connecting electrode 38-3 is formed on top of the first additional gate electrode 38-1 and second additional gate electrode 38-2. The first additional gate electrode 38-1 and second additional gate electrode 38-2 may be electrically connected to the driving gate electrode 37 or source electrode 33a, or may be electrically floated. In FIGS. 3A to 3J, a semiconductor device was explained wherein the driving gate electrode 37 contacts the active layer 31 or substrate 30 and forms a schottky contact. Such a structure may be related to an RF (RadioFrequency) device.

Figure 4:
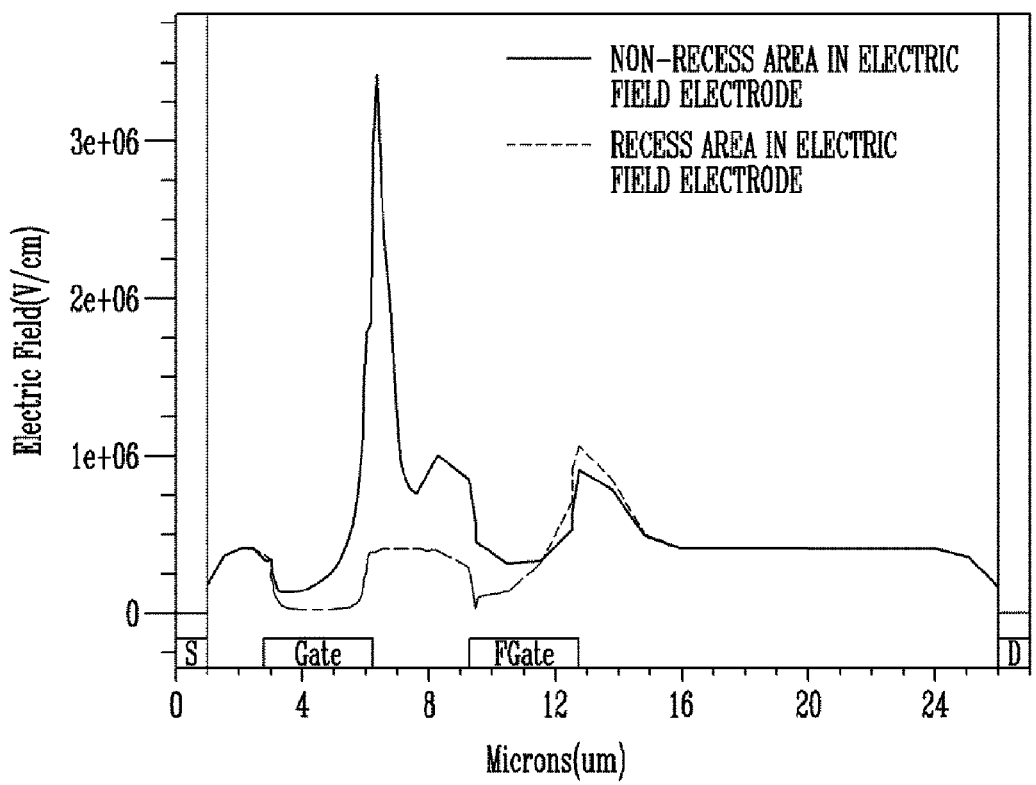
FIG. 4 is a view for explaining a result of simulating a size of an electric field per area of the semiconductor device according to an embodiment of the present disclosure.

FIG. 4 is a view for explaining a result of simulating a size of an electric field per area of the semiconductor device according to an embodiment of the present disclosure. FIG. 4 shows the result of simulating changes in a size of an electric field as a function of a flowing direction of a current or hole with reference to a source electrode (S) regarding the semiconductor device of FIG. 2L or FIG. 3J. In FIG. 4, it can be seen that changes in a size of an electric field as a function of each recess area (between A and A') and non-recess area (between B and B') are simulated. The non-recess area having the strongest electric field is a gate edge in a drain direction, that is, the area in the gate closest from a drain electrode (D), an electric field value at the gate edge being $3.5 \times 10^6$ V/cm. On the other hand, as for the recess area, an electric field value at the gate edge in the drain direction is reduced to $5 \times 10^5$ V/cm. That is, it can be seen that due to the first additional gate electrode 29-1, 38-1, Fgate and second additional gate electrode 29-2, 38-2 formed in the recess area, the maximum value of the electric field being applied to the semiconductor device is reduced.

FIG. 5 is a flowchart for explaining the method for fabricating a semiconductor device according to an embodiment of the present disclosure. Hereinafter, explanation will be made with reference to FIGS. 2A to 2L and FIG. 5.

At the step of forming the active layer on top of the substrate (S100), the active layer 21 is formed on top of the substrate 20. The materials constituting the substrate 20 and active layer 21 were already explained by way of an example.

At the step of forming the protective layer on top of the active layer (S200), the protective layer 22 is formed on top of the active layer 21. The materials constituting the protective layer 22 were already explained by way of an example.

At the step of forming the first aperture and second aperture (S300), the step of etching (S310) and the step of etching again (S320) are performed. At the step of etching (S310), the protective layer 22 is etched to have the first aperture h1. The active layer 21 corresponding to the first aperture h1 may be etched entirely or partially, and in a subsequent process, the first additional gate electrode 29-1 may be formed in a position corresponding to the first aperture h1. At the step of etching (S310), the third aperture h3 may be formed at the same the first aperture h1 is formed. The second additional gate electrode 29-2 may be formed subsequently in a position corresponding to the third aperture h3.

At the step of etching again (S320), the protective layer 22 is etched to have the second aperture h2. The active layer 21 in a position corresponding to the second aperture h2 may be etched entirely or partially, and in a subsequent process, the driving gate electrode 28 may be formed in a position corresponding to the second aperture h2. In FIG. 5, the first aperture h1 is etched first, but the second aperture h2 may be formed first. Since the first aperture and second aperture are formed in a separate etching process, even if the etching specifications (etching width, etching depth etc.) for forming the first aperture h1 are different from the etching specifications for forming the second aperture h2, the first aperture h1 and second aperture h2 may be formed while satisfying the two etching specifications. When fabricating a depleted type mode device, the second aperture h2 may not be needed. In such a case, the step of etching again (S320) may be omitted.

At the step of forming the insulating layer (S400), after the insulating layer 26 is formed, the insulating layer 26 is selectively etched to form the sixth aperture h6 and seventh aperture h7. When the insulating layer 26 corresponding to the first aperture h1 is etched selectively, the first additional gate electrode 29-1 to be formed subsequently may contact the active layer 21 or substrate 20.

At the step of forming the source electrode and drain electrode (S500), the source electrode 27a and drain electrode 27b are each formed on top of the sixth aperture h6 and seventh aperture h7, respectively. The source electrode 27a and drain electrode 27b are electrically connected to the protective layer 22.

The step of forming the driving gate electrode and first additional gate electrode (S600) is a lift-off process, wherein the step of forming the photosensitive film (S610), the step of forming the metal layer (S620), and the step of removing the photosensitive film (S630) are performed. At the step of forming the photosensitive film (S610), the photosensitive film 25a is formed and patterned. At the step of forming the metal layer (S620), the metal layer is deposited. At the step of removing the photosensitive film (S630), the photosensitive film 25a is removed, the metal layer deposited on top of the photosensitive film 25a is removed together, and only the metal layer deposited on top of the insulating layer 26 due to the patterning is maintained. The first additional gate electrode 29-1 of the metal layer is formed in a position corresponding to the first aperture h1. Additionally, the driving gate electrode 28 of the metal layer is formed in a position corresponding to the second aperture h2, and the second additional gate electrode 29-2 of the metal layer may be formed in a position corresponding to the third aperture h3.

At the step of forming the connecting electrode (S700), the connecting electrode 29-3 that electrically connects the first additional gate electrode 29-1 and second additional gate electrode 29-2 is formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
    a substrate;
    an active layer formed on the substrate, the active layer extending in a first direction;
    a protective layer formed on the active layer and having a first aperture exposing a portion of the active layer in a second direction crossing the first direction;
    a source electrode formed on one side of the protective layer;
    a drain electrode formed on the other side of the protective layer;
    a driving gate electrode formed between the source electrode and the drain electrode in the first aperture, wherein the protective layer has second and third apertures adjacent to opposite ends of the driving gate electrode, the second and third apertures exposing opposite edges of the active layer in the second direction; and
    first and second gate width controlling electrodes formed in the second and third apertures on opposite edges of the active layer in the second direction between the driving gate electrode and the drain electrode in the first direction to control a channel width of the active layer in the second direction.

2. The semiconductor device according to claim 1, wherein the first and second gate width controlling electrodes are formed on top of a boundary, as viewed in the top plan view, of an active area affected by a voltage applied to each of the source electrode, the drain electrode, and the driving gate electrode.

3. The semiconductor device according to claim 1, wherein the active layer has a first trench with a thickness that is thinner than that of the active layer where the first trench is not formed, and formed in a position corresponding to the first aperture.

4. The semiconductor device according to claim 3, further comprising an insulating layer formed between the active layer and the first gate width controlling electrode, wherein the first aperture is separated from the second aperture by a cross-section of the insulating layer.

5. The semiconductor device according to claim 3, wherein the first gate width controlling electrode is located at least partially within the first trench.

6. The semiconductor device according to claim 1, wherein the semiconductor device further comprises an insulating layer formed between the substrate and the first gate width controlling electrode.

7. The semiconductor device according to claim 1, wherein the active layer comprises a buffer layer formed on top of the substrate, and a barrier layer formed on top of the buffer layer,
    a material constituting the buffer layer comprises GaN,
    a material constituting the barrier layer comprises AlGaN, and
    a material constituting the protective layer comprises GaN.

8. The semiconductor device according to claim 1, wherein the source electrode, drain electrode, driving gate electrode, and first gate width controlling electrode are made of at least one selected from Ti, Al, Ni, Au, Ge, and Pt.

9. The semiconductor device according to claim 1, wherein the first gate width controlling electrode comprises a first additional gate electrode lower part having a first width and a first additional gate electrode upper part having a second width that is larger than the first width,
    the second gate width controlling electrode comprises a second additional gate electrode lower part having a third width and a second additional gate electrode upper part having a fourth width that is larger than the third width, and
    the semiconductor device further comprises a connecting electrode formed on top of the first gate width controlling electrode and second gate width controlling electrode, and configured to electrically connect the first gate width controlling electrode and second gate width controlling electrode.

10. The semiconductor device according to claim 1, further comprising:
    an insulating layer on the protective layer,
    wherein the active layer includes a first trench at a location corresponding to the first aperture,
    wherein a width of the first trench in the active layer is greater than a width of an opening in the insulating layer, and
    wherein the first gate width controlling electrode extends through the opening in the insulating layer into the trench in the active layer to contact one of the active layer and the substrate.

11. The semiconductor device according to claim 1, wherein the second aperture includes a trench extending in a line in a width direction,
    the first aperture is spaced apart from the second aperture in a length direction perpendicular to the width direction, such that the first aperture is separated from the second aperture by the cross-section of the active layer and the protective layer in the length direction.

12. The semiconductor device according to claim 1, wherein the second aperture includes a trench extending in a line in a width direction,
   the first and third apertures are spaced apart from the second aperture in a length direction perpendicular to the width direction, and
   the third aperture is spaced apart from the first aperture in the width direction.

13. The semiconductor device according to claim 1, further comprising a connecting electrode extending in the first direction to electrically connect the first gate width controlling electrode to the second gate width controlling electrode.

14. The semiconductor device according to claim 13, further comprising an insulating layer formed between the substrate and the first gate width controlling electrode, between the substrate and the second gate width controlling electrode, and on the protective layer,
   wherein the connecting electrode extends between the first gate width controlling electrode and the second gate width controlling electrode on the insulating layer.

* * * * *